United States Patent [19]
Radziun et al.

[11] Patent Number: 6,160,399
[45] Date of Patent: Dec. 12, 2000

[54] APPARATUS FOR SUPPORTING MR GRADIENT COIL ASSEMBLY

[75] Inventors: Michael J. Radziun, Waterford; David E. Dean, Hartland; Scott T. Mansell, Waterford, all of Wis.

[73] Assignee: General Electric Company, Milwaukee, Wis.

[21] Appl. No.: 09/348,731

[22] Filed: Jul. 6, 1999

[51] Int. Cl.[7] ..................................................... G01V 3/00
[52] U.S. Cl. ........................................... 324/319; 324/322
[58] Field of Search .................................... 324/318, 322, 324/309, 307, 319

[56] References Cited

U.S. PATENT DOCUMENTS

| 5,084,676 | 1/1992 | Saho et al. | 324/318 |
| 5,235,283 | 8/1993 | Lehne et al. | 324/318 |
| 5,570,021 | 10/1996 | Dachniwskyj et al. | 324/318 |
| 5,792,210 | 8/1998 | Pla et al. | 324/318 |

Primary Examiner—Christine Oda
Assistant Examiner—Brij B. Shrivastav
Attorney, Agent, or Firm—Skarsten Law Offices; Christian G. Cabou; Phyllis Y. Price

[57] ABSTRACT

In an MR system, a mounting assembly is provided at each end of the bore of the main magnet for supporting a cylindrical gradient coil assembly within the bore. Each mounting assembly comprises first and second brackets, the first bracket being provided with a concave bearing surface having a specified curvature. The first bracket is fixably joined to the main magnet proximate to the lower side of the bore, and the second bracket is provided with a convex bearing surface which is selectively similar to the curvature of the concave bearing surface of the first bracket. The second bracket is attached to a lower portion of the gradient coil, so that the convex bearing surface extends longitudinally outward from the gradient coil assembly. A vibration attenuator is positioned between the convex and concave bearing surfaces of each mounting assembly, the vibration attenuator acting to transmit a static force between the two bearing surfaces to support the gradient coil assembly within the bore. At the same time, the vibration attenuator acts to oppose transmission of mechanical vibrations from the gradient coil assembly to the main magnet. The vibration attenuator comprises first and second pads formed of elastomeric vibration isolation material, which are joined together in a stacked interlocking relationship.

17 Claims, 4 Drawing Sheets

APPARATUS FOR SUPPORTING MR GRADIENT COIL ASSEMBLY

BACKGROUND OF THE INVENTION

The invention disclosed and claimed herein generally pertains to improved apparatus for supporting or mounting the respective coils of a gradient coil assembly within the bore of the main magnet of a magnetic resonance (MR) imaging system. More particularly, the invention pertains to apparatus of the above type which provides very effective vibration isolation, that is, which substantially prevents transfer of mechanical vibrations from the MR gradient coil assembly to the main magnet and to structures adjacent thereto. Even more particularly, the invention pertains to apparatus of the above type which is comparatively simple and inexpensive, and which achieves its purposes without degrading image quality, and without adding limitations to current transportation and handling procedures.

As is well known by those of skill in the art, an MR scanner or imaging system requires gradient coils to generate the X-, Y-, and Z-gradient fields required for imaging. In a common arrangement, each gradient field is produced by a pair or set of gradient coils, wherein each coil is wrapped around one of two cylindrical coil forms. The two coil forms are placed in coaxial relationship, and the coil forms and respective X-, Y- and Z-gradient coils collectively comprise a gradient coil assembly. Arrangements of this type are described, for example, in U.S. Pat. No. 5,570,021, issued Oct. 29, 1996 and commonly assigned herewith to the General Electric Company. Two of the inventors named in such patent are coinventors herein. Such arrangements are also described in U.S. Pat. No. 5,760,584, issued Jun. 2, 1998 and likewise assigned to the General Electric Company. Typically, the gradient coil assembly must be mechanically supported within the cylindrical bore of a static or main magnet, which is another essential component for an MR imaging system.

As is further well known, respective gradient coils of an MR system are electrically excited to impose time varying magnetic fields on the primary or static magnetic field, which is produced by the main magnet. When a gradient coil is subjected to such excitation, the coil tends to be mechanically displaced or vibrated. Frequently, the mechanical structure used to support the gradient coil assembly within the main magnet bore provides a path for transferring or coupling the vibrations of the gradient coils to the main magnet structure. Generally, the main magnet is supported on the floor of the building in which the MR system is operated. Accordingly, the gradient generated vibrations may be directly coupled from the magnet to the floor, and then travel therethrough to vibrate structures throughout the building. As a result, gradient coil vibrations can couple acoustically to rooms outside of the MR scan room, i.e., a room which is specially constructed to house the MR system.

It will be readily apparent that the transmission of gradient coil vibrations through building structure is particularly undesirable when the MR system is used in a hospital or other health care facility. Moreover, the recent introduction of shorter and lighter high field magnets now allows users to install MR systems in areas of hospitals and clinics that are located close to occupied rooms, such as patient rooms and doctor examination rooms. This development has made the transfer of gradient coil-induced noise even more objectionable. Such noise may appear to be nearly as great in rooms which are proximate to the MR scan room as it is within the scan room itself. However, past efforts to reduce vibrations generated by MR gradient coils have been, at best, only partially successful. A gradient coil must be mechanically stable, with respect to the main magnet, during the imaging sequence. Otherwise, image quality may be reduced or degraded. Also, it is very desirable to have the gradient coils physically connected to the main magnet for transportation purposes. This provides the ability to transport the magnet to a site of use without any need for shipping constraints, which would otherwise need to be removed upon arrival at the site.

SUMMARY OF THE INVENTION

The invention is generally directed to an MR system provided with a cylindrical gradient coil assembly and with a main magnet having a bore. More specifically, the invention is directed to a mounting assembly or like apparatus for supporting the gradient coil assembly within the bore, wherein one mounting assembly is positioned at each end of the bore. Each mounting assembly comprises a first bracket provided with a concave load bearing surface having a specified curvature, the first bracket being fixably joined to the main magnet proximate to the bore. The mounting assembly further comprises a second bracket provided with a convex bearing surface which substantially matches the curvature of the concave bearing surface of the first bracket. The second bracket is fixably joined to the gradient coil assembly at a specified end thereof by means of screws or the like, so that the convex bearing surface of the second bracket extends longitudinally outward from the specified end. A vibration attenuator, comprising a plurality of pads of selected elastomeric or vibration attenuating material, are positioned between the convex and concave bearing surfaces for transmitting therebetween at least a portion of the static force required to support the gradient coil assembly within the bore. At the same time, the pads of the vibration attenuation material act to oppose transmission of mechanical vibrations from the gradient coil assembly to the main magnet.

In a preferred embodiment of the invention, the vibration attenuator comprises first and second pads formed of the vibration attenuating material, each pad being provided with a pattern of alternating bar elements and grooves. The bar elements of each pad are insertable into corresponding grooves of the other, to join the first and second pads together in an interlocking relationship. Thus, the two pads of vibration attenuating material cooperate to oppose vertical, longitudinal and transverse vibratory movements of the gradient coil assembly with respect to the main magnet. At the same time, the mounting assemblies do not degrade or adversely affect the quality of images produced by the MR system.

BRIEF DESCRIPTIONS OF THE DRAWINGS

DETAILED DESCRIPTION OF THE PREFERRED EMBODIMENT

Figure 1:
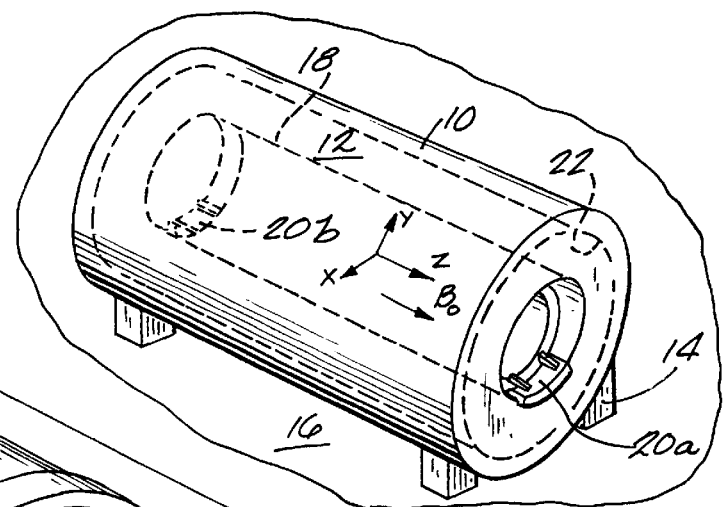
FIG. 1 is a simplified perspective view showing an embodiment of the invention with respect to certain components of an MR imaging system.

Referring to FIG. 1, there is shown a main magnet 10, of a type which is commonly used in connection with MR high field imaging systems. Magnet 10 may comprise a superconductive, permanent or other magnet, of a type well known in the art to produce a static $B_0$ magnetic field as required for MR imaging. Magnet 10 is provided with a bore 12 for receiving patients or other subjects of imaging (not shown), and the $B_0$ field is directed along the bore axis. Steel legs 14 are provided to support the main magnet 10 on a floor 16, when the main magnet 10 and other components of an MR imaging system (not shown) are set up for use in a health care facility such as a hospital or clinic.

FIG. 1 further shows a gradient coil assembly 18, comprising a hollow cylindrical structure, likewise positioned in bore 12. As is well known, gradient coil assembly 18 contains coils (not shown) for generating respective X-, Y-, and Z-gradient fields within magnet bore 12 which are required for MR imaging. The gradient fields are respectively oriented relative to X-, Y-, and Z-coordinate axes, wherein the Z-axis is aligned along the axis of bore 12.

As stated above, substantial mechanical vibrations can be generated in the gradient coils when the coils are electrically excited to produce time varying gradient fields. If these vibrations are transferred to the main magnet 10, they may pass therethrough to the floor 16 and then travel to other locations of the building in which main magnet 10 resides. As also stated, noise caused by the gradient coil vibrations could be particularly disturbing in a hospital or other health care environment. Accordingly, FIG. 1 shows gradient coil assembly 18 supported within bore 12 of main magnet 10 by means of two mounting assemblies 20a and 20b, which are located at the two opposing ends of main magnet 10 and gradient coil assembly 18. The mounting assemblies 20a and 20b, which are identical and are described hereinafter in further detail, transmit a static force from main magnet 10 to gradient coil assembly 18 to hold the assembly 18 in place within bore 12, in coaxial relationship with the bore and in spaced-apart relationship with the bore wall 22. At the same time, the two mounting assemblies act to dampen or attenuate the gradient coil vibrations, and thus oppose passage of such vibrations through the mounting assemblies. It will be seen that the arrangement of FIG. 1 provides no other path through which gradient coil vibrations can be transferred from the gradient coil assembly to the main magnet.

Figure 2:
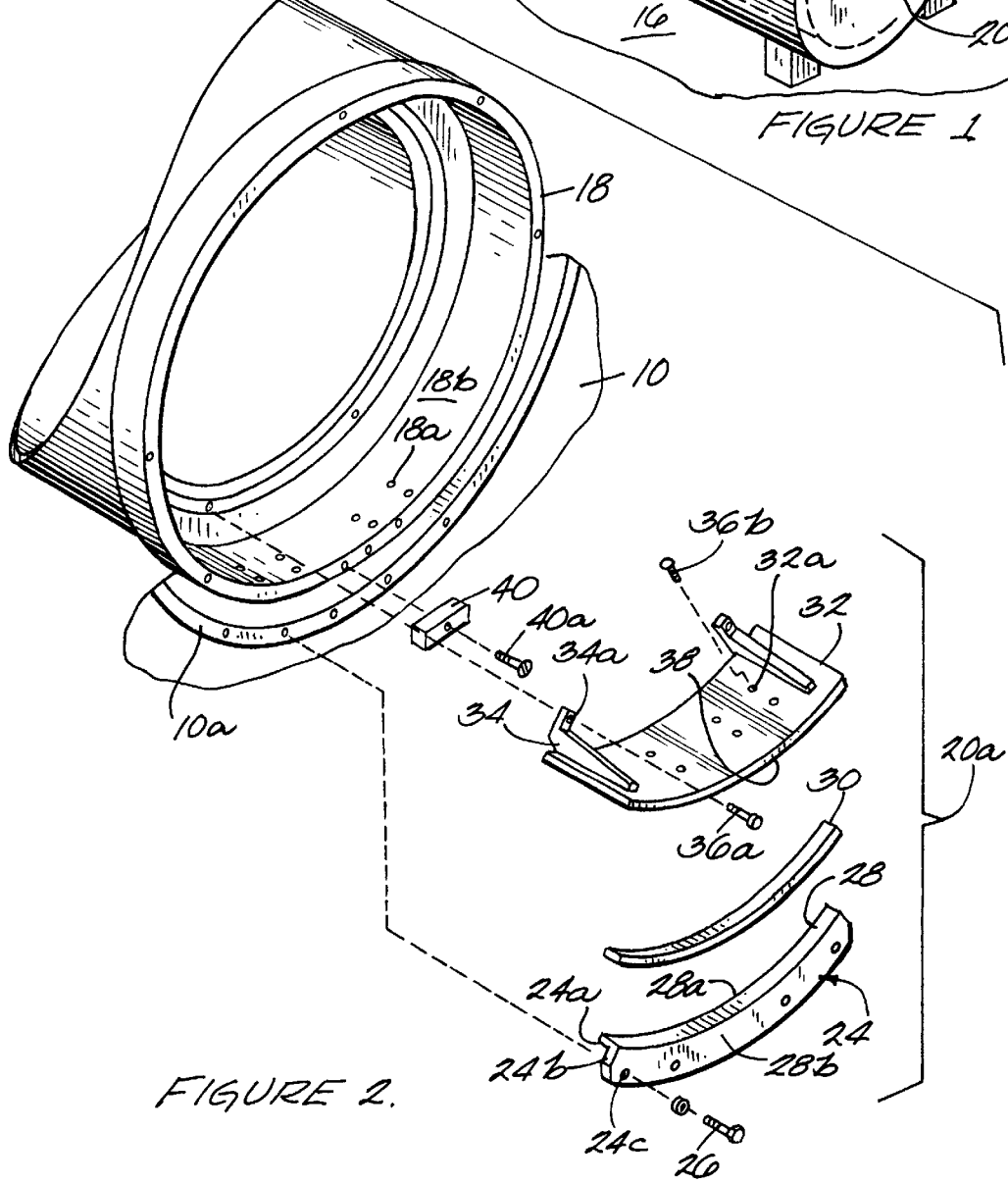
FIG. 2 is an exploded perspective view showing components of the embodiment of FIG. 1.

Referring to FIG. 2, there is shown mounting assembly 20a including a bracket 24. Bracket 24 comprises an arcuate bearing member 24a and an attachment member 24b joined thereto, to form an integral structure. Attachment member 24b is provided with screw holes 24c, which receive screws 26 for rigidly attaching bracket 24 to an end ring 10a of main magnet 10, at a location thereof which is proximate to the lower side of bore 12, as viewed in FIG. 2. For purposes of illustration, FIG. 2 shows only portions of main magnet 10 and end ring 10a.

FIG. 2 further shows bearing member 24a provided with a concave bearing surface 28 of selected curvature, which is oriented upwardly as viewed in FIG. 2. For example, bearing surface 28 may be curved to lie along an arc of a hypothetical circle having an extent on the order of 70°. Usefully, surface 28 is curved to lie along an arc of a circle having a diameter on the order of 95 centimeters, for employment with certain classes of MR scanners currently in common use. A vibration attenuator 30, comprising a number of strips or pads of vibration isolation material, is sized for placement and support upon concave bearing surface 28. The strips of vibration isolation material are formed of flexible elastomeric material such as neoprene or other synthetic rubber, and have a construction which is described hereinafter in further detail. The strips or pads are stacked together in interlocking relationship, as likewise described hereinafter. Usefully, raised edges 28a and 28b are positioned along bearing surface 28, and are spaced apart a distance equal to the width of vibration attenuator 30. Attenuator 30 may thereby be positioned between and retained by the raised edges 28a and 28b.

Referring further to FIG. 2, there is shown mounting assembly 20a further comprising an arcuate bracket 32, having positioning arms 34 fixably joined thereto. Arms 34 are respectively provided with screw holes 34a, which receive screws 36a for initially attaching bracket 32 to an end of gradient coil assembly 18, proximate to a lower portion thereof as viewed in FIG. 2. The initial attachment aligns screw holes 32a, formed through bracket 32, with respectively corresponding screw holes 18a provided in end ring 18a of gradient coil assembly 18. Thereupon, screws 36b are inserted into respective aligned screw holes, to rigidly attach bracket 32 to gradient coil assembly 18, and the positioning screws 36a are removed. Bracket 32 is designed so that when it is attached to the gradient coil assembly, it extends longitudinally outward from the end thereof, that is, in the direction of the axis of the gradient coil assembly aligned along the axis of bore 12. The underside of bracket 32, comprising a convex load bearing surface 38, is placed upon vibration attenuator 30, which is supported by bearing surface 28 of bracket 24. The curvatures of bearing surfaces 28 and 38 are selectively similar. Thus, when bearing surface 38 is in place on vibration attenuator 30, the curvature of bearing surface 38 matches the curvature of the upper surface of attenuator 30, as viewed in FIG. 2, and the curvature of bearing surface 28 matches the curvature of the lower surface of attenuator 30. Bearing surface 38 is curved to lie along an arc of a hypothetical circle having a diameter which is slightly less than the diameter of the circle associated with bearing surface 28, and which has an extent likewise on the order of 70°. Accordingly, bearing surface 38 is readily nested or seated upon bearing surface 28 and supported thereby, with vibration attenuator 30 therebetween.

Figure 3:
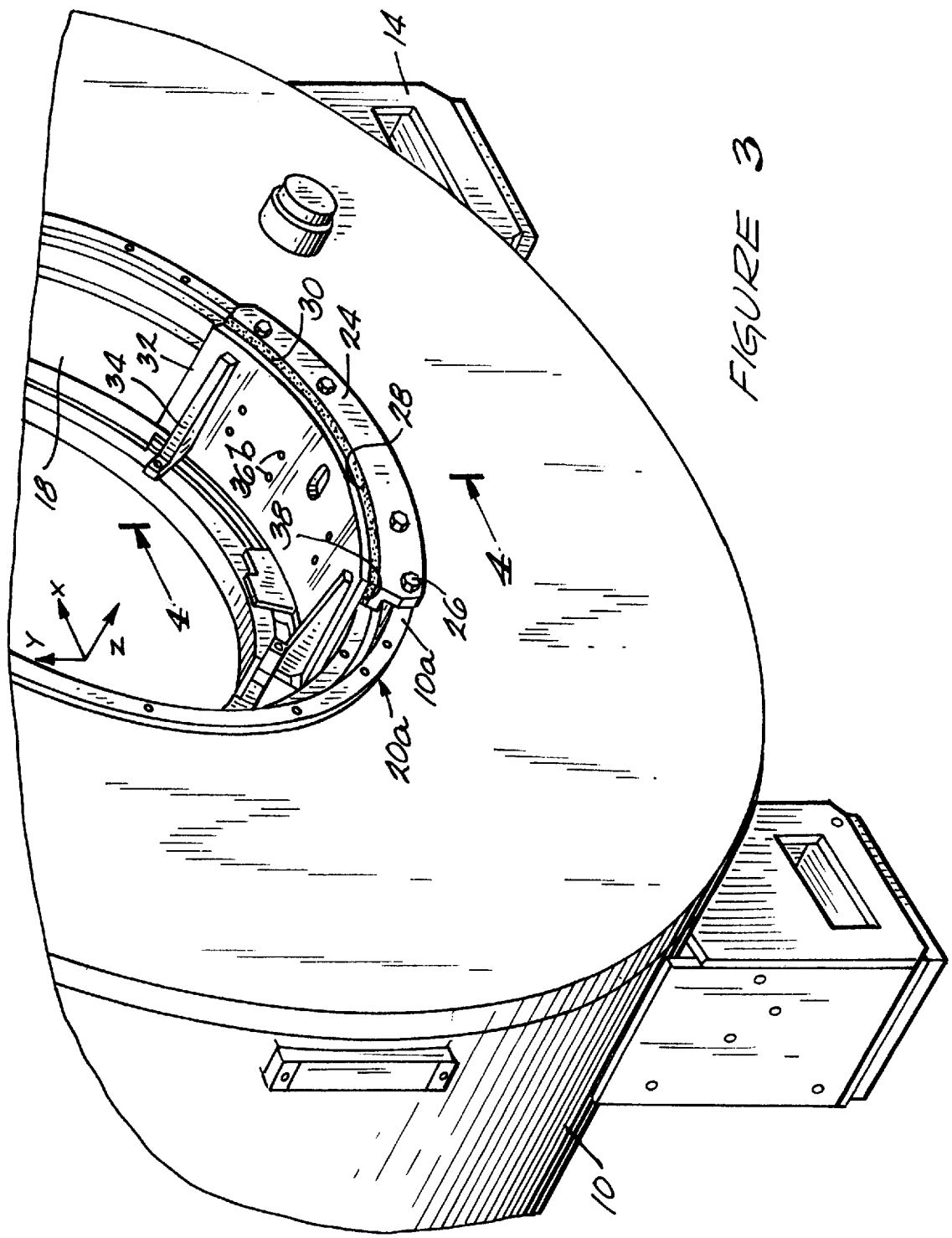
FIG. 3 shows a portion of FIG. 1 in greater detail.
Figures 4, 5:
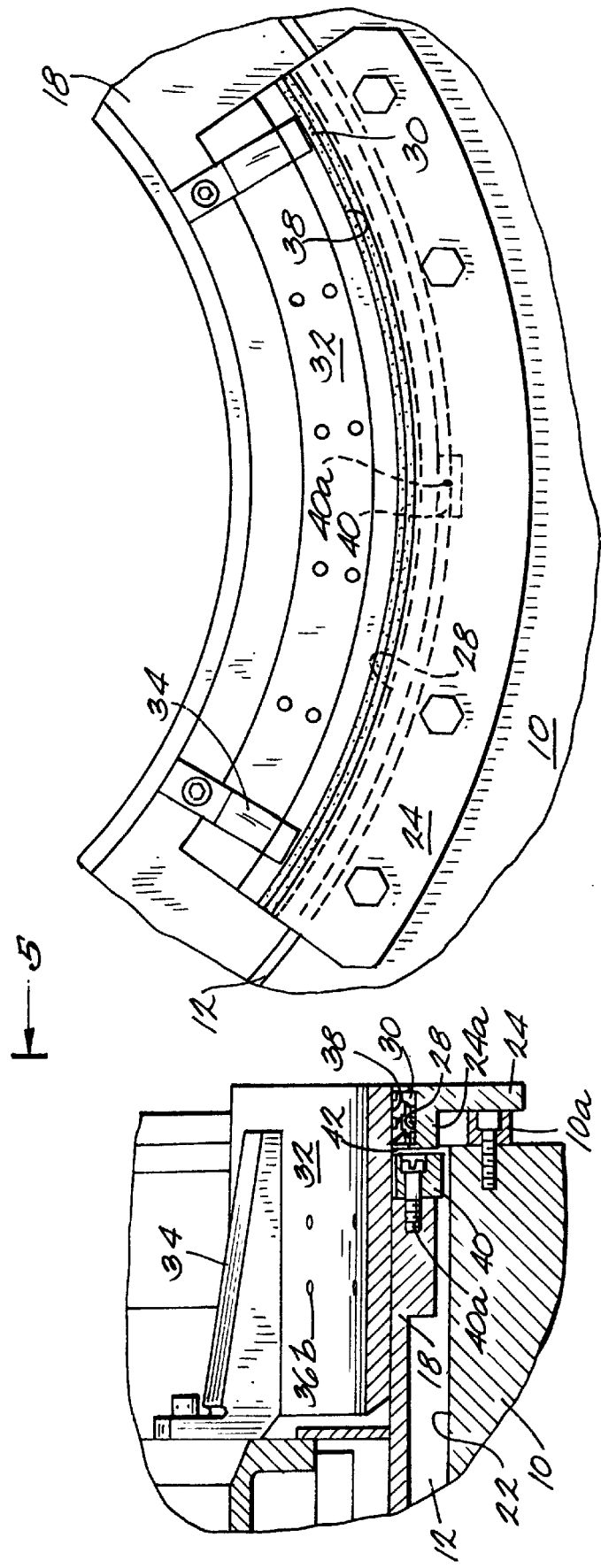
FIG. 4 is a sectional view taken along lines 4—4 of FIG. 3.
FIG. 5 is an end view taken along lines 5—5 of FIG. 4.

Referring to FIGS. 3 and 4 together, there are shown brackets 24 and 32 of mounting assembly 20a attached to main magnet 10 and to gradient coil assembly 18, respectively, as described above. There is further shown bearing surface 38 of bracket 32 seated upon bearing surface 28 of bracket 24, with vibration attenuator 30 positioned therebetween. A static force, which is sufficient to support at least half the weight of gradient coil assembly 18, is transmitted from bracket 24 to bracket 32 through the respective bearing surfaces thereof, and through vibration attenuator 30. Mounting assembly 20b, supporting gradient coil 18 at the other end of main magnet 10 as shown in FIG. 1, provides the balance of the static force necessary to support gradient coil assembly 18 within bore 12 of the main magnet 10, as described above in connection with FIG. 1. At the same time, the vibration attenuators 30 are constructed to substantially prevent transmission of mechanical forces in the audio frequency range which are produced by vibratory motion of gradient coil assembly 18, as a result of gradient coil excitation. Accordingly, such forces may not be transmitted to the main magnet through the mounting assemblies 20a and 20b. It is to be emphasized that the mounting assemblies 20a and 20b do not require any screws or other metal fastening elements which extend between the gradient coil assembly and the main magnet. Thus, the mounting assemblies provide no path through which acoustic vibrations could be coupled or conducted from the gradient coil assembly to the main magnet or surrounding structure.

Referring further to FIG. 4, there is shown a bumper element 40, which is joined to gradient coil assembly 18 by a screw 40a. The bumper element is positioned behind curved bracket 24 of the mounting assembly, in order to absorb any longitudinally directed shock or force applied thereto. Bumper element 40 is further shown in FIG. 2 and FIG. 5. FIG. 4 further shows a gap or space 42 which must be provided between the bearing member portion 24a of bracket 24, and bumper 40 and bumper screw 40a.

Figure 6:
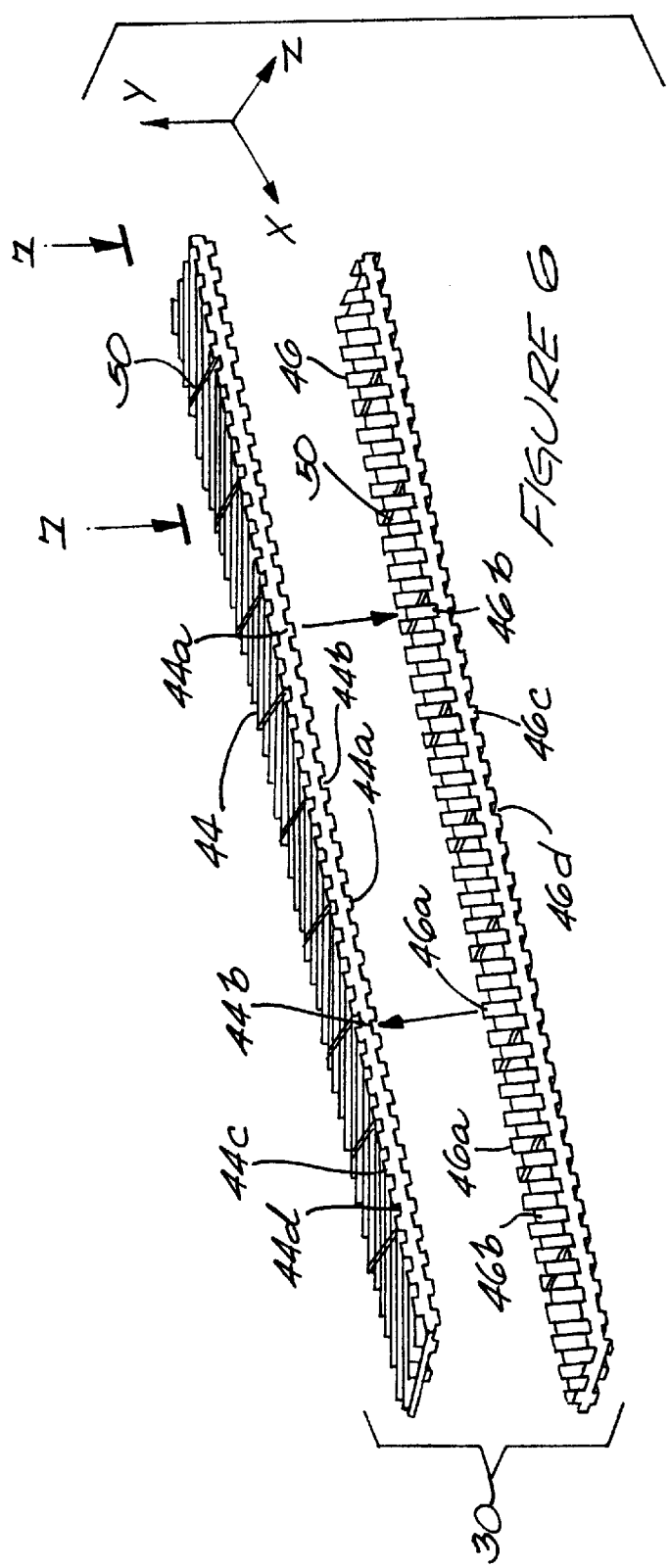
FIG. 6 is a perspective view showing two pads of vibration isolation or attenuating material for the embodiment of FIG. 1.
Figure 8:
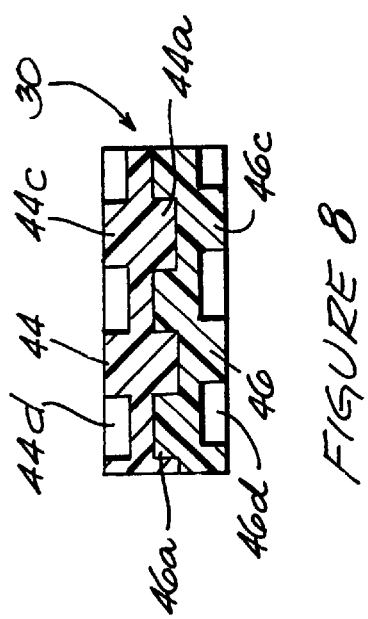
FIG. 8 is a sectional view taken along lines 8—8 of FIG. 7.
Figure 7:
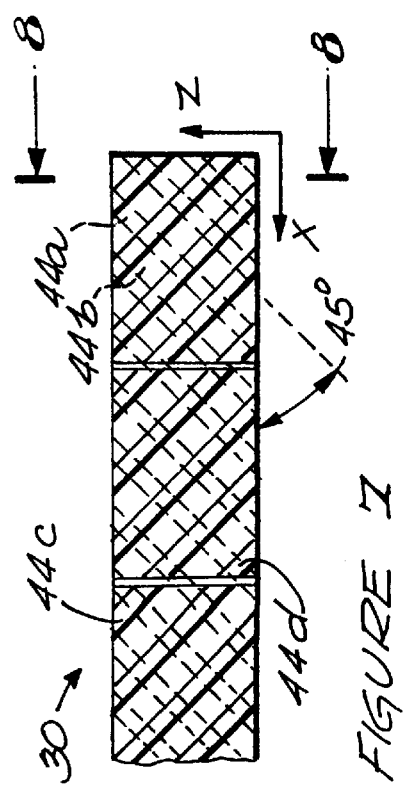
FIG. 7 is an overhead view of the pads of FIG. 6, taken taken along lines 7—7 when the pads are joined together in interlocking relationship.

Referring to FIGS. 6–8, there is shown vibration attenuator 30 comprising two strips or pads 44 and 46, formed of a compliant or elastomeric material. Pad 44 is formed or molded so that the underside thereof, as viewed in FIG. 6, is provided with bars 44a, of rectangular cross section. Bars 44a are spaced apart from one another, in parallel relationship, to provide or define grooves 44b in alternating relationship with bars 44a. Similarly, the upper side of pad 46, as viewed in FIG. 6, is provided with a pattern of alternating bars 46a and grooves 46b, in parallel relationship. Moreover, each bar 44a has the same cross sectional dimensions as each groove 46b, and each bar 46a has the same cross sectional dimensions as each groove 44b. Thus, pads 44 and 46 can be brought together so that bars 44a are inserted into corresponding grooves 46b in a fitted relationship, and so that bars 46a are inserted into corresponding grooves 44b, likewise in a fitted relationship, as illustrated by the arrows in FIG. 6. Pads 44 and 46 are thus placed in an interlocking relationship to form vibration attenuator 30, as best shown by FIG. 8.

As best shown by FIG. 7, respective bars 44a and grooves 44b are oriented at an angle of 45° with the edges of pad 44. Bars 46a and grooves 46b are likewise oriented at an angle of 45° with the edges of pad 46. Such orientation is very useful in opposing transfer or transmission of vibratory motion, from respective brackets 32 of mounting assemblies 20a and 20b to the corresponding brackets 24 thereof. Referring again to FIG. 3, there is shown vibration attenuator 30 positioned by mounting assembly 20a so that the short edges of the pads 44 and 46 are parallel to the Z-axis of the associated MR scanner. As is well known, in the rectangular coordinate system of an MR scanner, the Z-axis is directed along the bore axis of the main magnet. As further shown by FIG. 3, the long edges of the pads 44 and 46 extend in a direction which is generally parallel to the X-axis. By providing such arrangement, the bars 44a and 46a and the grooves 44b and 46b of the interlocking pads are respectively oriented at an oblique 45° angle with respect to both the X- and Z-axes. Accordingly, if vibratory motion of the gradient coil assembly 18 has a translational component directed along the Z-axis (i.e., longitudinal motion), and if such motion component is transferred from the gradient coil assembly to pad 44, it will be opposed by the bars 46a of pad 46 acting against the bars 44a of pad 44. Interaction between bars 44a and 46a will likewise oppose a translational component of vibratory motion directed in the X-Y plane (i.e., transverse or vertical motion), as well as rotational components of vibratory motion about the Y- and Z-axes. Moreover, by providing pads 44 and 46 with the arrangement of interlocking bars and grooves, the effective part or area of interaction of the elastomeric pads is substantially enhanced. Thus, the two interlocking pads 44 and 46 of the attenuators 30 provide a very effective barrier against the transfer of vibratory motion from gradient coil 18 to main magnet 10. Pads 44 and 46 are usefully formed of a material sold by the Barry Control Corporation under the trade name DIM, although the invention is by no means limited thereto. In one embodiment, the pads 44 and 46 have a width on the order of 5 centimeters, and respective grooves of each pad have a depth on the order of 33 millimeters. Usefully, to enhance bending or flexibility of the strips a cut or score 50 is formed part way through each strip, at spaced-apart intervals on the order of 5 centimeters.

Referring further to FIGS. 6–8, there is shown the upper side of pad 44, as viewed in FIG. 6, provided with an alternating pattern of bars 44c and grooves 44d. There is also shown the lower side of pad 46, as viewed in FIG. 6, provided with an alternating pattern of bars 46c and grooves 46d. FIG. 7 shows the bars 44c and grooves 44d to be oriented at an angle of 90° with respect to the bars 44a and grooves 44b of pad 44. Similarly, the bars 46c and grooves 46d of pad 46 are oriented at 90° to the bars 46a and grooves 46b thereof.

It is to be noted that transmission of transverse vibratory motion between the brackets 32 and 24 is further constrained by providing the brackets with an arcuate geometry, as described.

In a modification of the invention, vibratory attenuators could be employed which included three or more elastomeric pads, stacked together in interlocking relationship, rather than the two pads 44 and 46 shown in connection with the attenuators 30.

Obviously, many other modifications and variations of the present invention are possible in light of the above teachings. It is therefore to be understood that within the scope of the disclosed concept, the invention may be practiced otherwise than as has been described.

What is claimed is:

1. In an MR system provided with a cylindrical gradient coil assembly and with a main magnet having a bore, apparatus for supporting said gradient coil assembly within said bore comprising:

a first bracket provided with a concave bearing surface having a specified curvature, said first bracket being disposed for fixable attatchment to said main magnet proximate to said bore;

a second bracket provided with a convex bearing surface which is selectively similar to the curvature of said concave bearing surface of said first bracket, said second bracket being disposed for fixable attatchment to a specified end of said gradient coil assembly so that said convex bearing surface extends longitudinally outward from said specified end; and a vibration attenuator comprising a plurality of pads of selected vibration attenuating material, said pads being positioned together in stacked cooperative relationship between said convex and concave bearing surfaces for transmitting therebetween at least a portion of the static force required to support said gradient coil assembly within said bore, said pads further operating to oppose transmission of mechanical vibrations from said gradient coil assembly to said main magnet.

2. The apparatus of claim 1 wherein:

said vibration attenuator comprises first and second pads of said vibration attenuating material which are positioned between said convex and concave bearing surfaces in an interlocking relationship to oppose translation of said gradient coil assembly, with respect to said main magnet, along each of a plurality of orthogonal axes of translation, and to oppose rotation of said gradient coil assembly, with respect to said main magnet, about each of a plurality of orthogonal axes of rotation.

3. The apparatus of claim 2 wherein:

said first and second pads are each provided with a pattern of alternating bar elements and grooves, the bar elements of each pad being insertable into respectively corresponding grooves of the other pad to join said first and second pads into said interlocking relationship.

4. The apparatus of claim 3 wherein:

the bar elements and grooves of said first and second pads are oriented in oblique relationship with respect to rectangular coordinate axes of said MR system, when said first and second pads are positioned between said convex and concave bearing surfaces.

5. The apparatus of claim 4 wherein:

said first and second pads are respectively formed of selected elastomeric material.

6. The apparatus of claim 4 wherein:

said bar elements and grooves are oriented at an angle on the order of 45° with respect to said rectangular coordinate axes.

7. The apparatus of claim 2 wherein:

said apparatus comprises a first mounting assembly, and a second mounting assembly, which is substantially identical thereto, is positioned between said main magnet and said gradient coil assembly proximate to the end thereof opposing said specified end, so that said gradient coil assembly is supported with respect to said main magnet solely by said first and second mounting assemblies.

8. The apparatus of claim 2 wherein:

said convex and concave bearing surfaces are respectively curved to lie along an arc having an extent which is on the order of 70°.

9. The apparatus of claim 8 wherein:

said pads are partially scored at specified intervals along their lengths to enhance flexibility.

10. In an MR system provided with a cylindrical gradient coil having two opposing ends and with a main magnet having a bore, mounting assemblies disposed for placement at each of said ends for supporting said gradient coil assembly within said bore and in spaced-apart relationship with the wall of said bore, each of said mounting assemblies comprising:

a first bracket provided with a concave bearing surface having a specified curvature;

means for fixably attaching said first bracket to said main magnet proximate to said bore;

a second bracket provided with a convex bearing surface which is selectively similar to the curvature of said concave bearing surface of said first bracket;

means for fixably attaching said second bracket proximate to a corresponding end of said gradient coil assembly so that said convex bearing surface of said second bracket can be placed in closely spaced relationship with said concave bearing surface of said first bracket; and vibration attenuator means, comprising a number of pads of selected elastomeric material, positioned in said space between said convex and concave bearing surfaces for transmitting therebetween at least a portion of the static force required to support said gradient coil assembly within said bore, and for opposing transmission of mechanical vibrations from said gradient coil assembly to said main magnet.

11. The mounting assembly of claim 10 wherein:

said vibration attenuator means comprises first and second pads of said elastomeric material which are provided with first and second pad surfaces, respectively, said first and second pad surfaces of said first and second pads being placed in specified interactive relationship with one another to cooperatively transmit said static force, and to oppose transmission of said vibrations.

12. The mounting assembly of claim 11 wherein:

said first and second pad surfaces are placed in interlocking relationship to oppose translation of said gradient coil assembly, with respect to said main magnet, along each of a plurality of orthogonal axes of translation, and to oppose rotation of said gradient coil assembly, with respect to said main magnet, about each of a plurality of orthogonal axes of rotation.

13. The mounting assembly of claim 11 wherein:

said first and second pad surfaces are each provided with a pattern of alternating bar elements and grooves, the bar elements of each pad surface being insertable into respectively corresponding grooves of the other pad surface to selectively enhance the total area of interaction between said first and second pad surfaces.

14. The mounting assembly of claim 12 wherein:

the bar elements and grooves of said first and second pad surfaces are oriented in oblique relationship with respect to rectangular coordinate axes of said MR system, when said first and second pads are positioned between said convex and concave bearing surfaces.

15. The mounting assembly of claim 14 wherein:

said bar elements and grooves are oriented at an angle on the order of 45° with respect to said rectangular coordinate axes.

16. The mounting assembly of claim 13 wherein:

said convex and concave bearing surfaces are respectively curved to lie along arcs of respectively corresponding hypothetical circles, each of said arcs having an extent which is on the order of 70°.

17. The mounting assembly of claim 13 wherein:

said pads are partially scored at specified intervals along their lengths to enhance flexibility.

* * * * *